United States Patent [19]

Saeki et al.

[11] Patent Number: 5,035,837

[45] Date of Patent: Jul. 30, 1991

[54] COPPER PASTE COMPOSITION

[75] Inventors: Shuji Saeki, Ohtsu; Masatoshi Suehiro; Masashi Echigo, both of Kyoto; Susumu Okada, Zushi; Masami Sakuraba, Nagaokakyo, all of Japan

[73] Assignees: Dia-Ichi Kogyo Seiyaku Co., Ltd., Kyoto; Dowa Mining Co., Ltd., Tokyo, both of Japan

[21] Appl. No.: 544,973

[22] Filed: Jun. 28, 1990

[30] Foreign Application Priority Data

Oct. 27, 1989 [JP] Japan ................................. 1-280048

[51] Int. Cl.$^5$ .......................... H01B 1/06; C03C 8/16
[52] U.S. Cl. .................................. 252/512; 252/518; 106/113; 106/118; 106/123; 106/126; 501/19; 501/20; 501/32
[58] Field of Search ............ 106/1.13, 1.18, 1.23-1.26; 252/512, 518; 501/19, 20, 32

[56] References Cited

U.S. PATENT DOCUMENTS 3,516,949  6/1970  Hoffman .............................. 252/514
4,172,919  10/1979  Mitchell ............................. 106/1.13
4,877,555  10/1989  Yuhaku et al. ...................... 106/1.13

FOREIGN PATENT DOCUMENTS 0125730  11/1984  European Pat. Off. .
0131778  1/1985  European Pat. Off. .
0257193  3/1988  European Pat. Off. .

OTHER PUBLICATIONS

European Search Report, dated Jan. 29, 1991, of European Patent Application EP 90 30 7467.
World Patent Index, Derwent-Publications Ltd., London, GB; & JP-A-62 263 894 (Matsushita Elec., JP) 16-11-1987.

*Primary Examiner*—William R. Dixon, Jr.
*Assistant Examiner*—Anthony J. Green
*Attorney, Agent, or Firm*—Marshall, O'Toole, Gerstein, Murray & Bicknell

[57] ABSTRACT

A copper paste composition for low temperature firing on a ceramic substrate is comprised of inorganic components and organic vehicle components. The inorganic components mainly consist of cooper powder, cuprous oxide powder, cupric oxide powder and glass powder. The mixing ratio off the inorganic components of this composition is 100 parts by weight of copper powder, about 10 to 15 parts by weight of cuprous oxide powder, about 12 to 17 parts by weight of cupric oxide powder, and about 7 to 12 parts by weight of glass powder. The mixing ratio of the inorganic components with the organic vehicle components is about 95 to 70 parts by weight of the organic vehicle components. Also the the average particle size of the copper powder is in a range of about 0.5 to 3 $\mu$m and the oxygen content of the copper powder is about 0.05 to 0.15 weight percent.

16 Claims, 1 Drawing Sheet

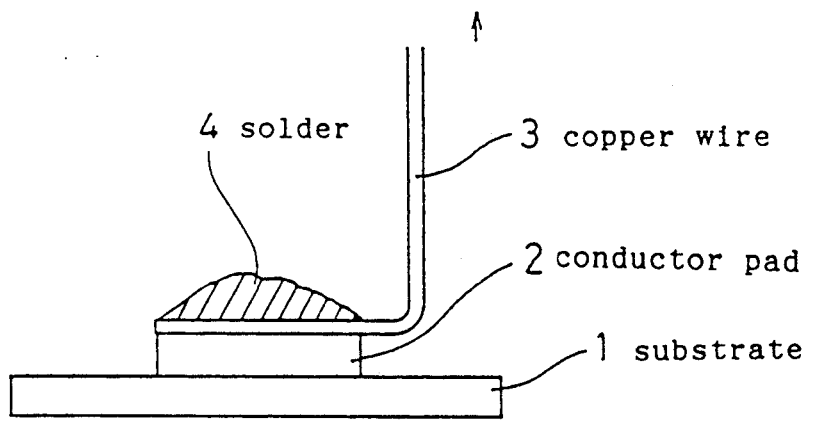
Figure

COPPER PASTE COMPOSITION

FIELD OF THE INVENTION

The present invention relates to copper paste compositions, in particular, copper paste compositions that are suited to low temperature firing at 550° C. to 50° C.

BACKGROUND OF THE INVENTION

Copper pastes can be fired onto ceramic or other refractory substrates to form a "thick film" conductor. Copper pastes for low temperature firing are disclosed in Japanese Patent Provisional Publication No. SHO-62-110202 and U.S. Pat. No. 4,521,329 relating to a conductor element. The conductor element described in the above-mentioned Japanese publication and U.S. Patent is made by kneading a composition including an organic medium containing an organic resin and firing the composition onto a ceramic substrate to pyrolyze the organic resin, leaving a conductive copper film. The composition is composed of metallic copper in the form of metallic copper coated with a copper oxide coating; copper oxide particles; and an inorganic binder, as follows: (a) 0.2 weight percent or more of oxygen in the form of a copper oxide coating, (b) copper oxide particles in an amount of 15 weight percent or less of the metallic copper, (c) an inorganic binder including copper oxide particles (d), the weight ratio of the copper oxide particles (d) to the copper oxide coating being 0 to 0.5 and the ratio of the total sum of copper oxide, as particles and coating; to the weight of oxide coated copper metal being 0 to 15 parts by weight of copper oxide to 100 parts by weight of oxide coated copper metal. The Japanese publication describes the oxygen in the metallic copper oxide coating and the oxygen in the copper oxide particles as sources for supplying oxygen for pyrolysis or combustion of the resin in the organic medium of the paste composition.

It is generally well known that copper oxide is used as an additive in copper pastes. For high temperature firing applications (850° C. to about 1000° C.) there is no need to distinguish cuprous oxide and cupric oxide since both equally form chemical bonds with ceramic substrates. Therefore, the mixing ratio of the cuprous oxide and cupric oxide does not matter as practiced in the prior art. However, for low temperature firing, as described below, it has been found that the effect of cuprous oxide on the solderability, initial joint strength, and strength after aging differs from that of cupric oxide.

It should be noted that oxygen in copper powder is present in the form of cuprous oxide rather than cupric oxide, and that this cuprous oxide does not directly contribute to combustion of the organic medium as an oxidizing agent, and lowers the degree of sintering when present in excess. Hence prior art copper pastes using copper powder with an oxygen content of 0.2 % or more by weight do not produce sufficient sintering after low temperature firing. As a result, the product has low resistance to soldering and, in particular, its strength after aging is significantly deteriorated.

The present invention has been made in view of such problems of the prior art. It is intended to provide copper paste compositions having, after low temperature firing, a high degree of sintering, good solderability, high initial joint strength, and high joint strength after aging.

SUMMARY OF THE INVENTION

The present invention, to accomplish the aforementioned objectives, is a copper paste composition composed of inorganic components and organic vehicle components. The inorganic components mainly consist of copper powder, cuprous oxide powder, cupric oxide powder and glass powder. The mixing ratio of the inorganic components of this composition is, for example, for each 100 parts by weight of copper powder, about 10 to 15 parts by weight of cuprous oxide powder, about 12 to 17 parts by weight of cupric oxide powder, and about 7 to 12 parts by weight of glass powder. The mixing ratio of the inorganic components with the organic vehicle components is about 95 to 70 parts by weight of the inorganic components and about 5 to 30 parts by weight of the organic vehicle components.

The present invention further includes a copper paste composition as described above where the average particle size of the copper powder is about 0.5 to about 3 $\mu$m and that the oxygen content of the copper powder is about 0.05 to about 0.15 weight percent.

BRIEF DESCRIPTION OF THE DRAWING

The FIGURE is an explanatory cross-sectional side view illustrating the method used for measuring joint strength.

DETAILED DESCRIPTION OF THE PREFERRED EMBODIMENT

Copper powder having a sufficient oxygen content, as described below, may be obtained, for example, by reducing cuprous oxide with hydrazine and then reducing with hydrogen.

Due to reasons discussed below the average particle size of the cuprous oxide powder is desirably within a range from about 0.5 to $\mu$m about 5 $\mu$m, and in particular, the range from about 0.5 $\mu$m to about 2 $\mu$m is specially desired.

There is no special need to limit the average particle size of the cupric oxide powder. The range, however, is desirably from about 0.5 $\mu$m to about 5 $\mu$m.

The softening point of the glass powder is preferably in a range from about 300° C. to about 600° C. due to reasons discussed below. The softening point is more preferably in a range from about 300° C. to about 550° C. There is no particular reason to limit the average particle size of the glass powder. The particle size range, however, is desirably between about 1 $\mu$m and about 10 $\mu$m.

The organic vehicle may be any commonly used organic vehicle. The organic vehicle typically is comprised of a solvent and a resin. For reasons discussed below, desirably there will be about 10 parts or less by weight of the resin for every 100 parts by weight of the organic vehicle. Suitable resins include ethyl cellulose, acrylic resins, methacrylic resins, terpene resins and mixtures thereof. Suitable solvents include terpineol, $C_{10}$ to $C_{18}$ alcohols and mixtures thereof Additionally, the organic vehicle optionally can include a suitable plasticizer such as dibutyl phthalate.

Additives to the above-mentioned components can include about 5 parts or less by weight of inorganic oxides, particularly metal oxides such as vanadium oxide, lead oxide, antimony oxide and mixtures thereof per 100 parts by weight of the copper powder. Furthermore, surfactants such as a dispersant for maintaining stability of the paste and a thickener optionally may be added.

The paste is typically prepared by mixing the required amounts of the components in any mixing device designed for pastes, such as in a universal mixer, until they form a paste, and then continuing homogenization of the composition, such as in a three roller mill.

One method for making a thick-film circuit from the prepared paste is to print the paste in an appropriate pattern on a refractory substrate (made of alumina in many cases) by means of a screen printing machine, dry the printed substrate, and then fire the printed substrate in a belt furnace filled with $N_2$ or other inert gas for a cycle of about 40 minutes to about 60 minutes. The peak temperature is from about 550° C. to about 750° C., and preferably from about 580° C. to about 650° C., and the time for keeping the printed substrate at the peak temperature is from about 5 minutes to about 10 minutes.

In low temperature firing of a copper paste, proper attention should be given to raising the degree of sintering, and to allowing easier evaporation of the organic vehicle. To achieve these objectives, the oxygen content in the copper powder should be kept within the appropriate range. If the oxygen content in the copper powder exceeds about 0.15 weight percent, sintering will become deficient, and in turn, solder wettability will be degraded, and the strength after aging will be deteriorated significantly. On the other hand, it is difficult and not practical to produce copper powder having an oxygen content less than about 0.05 weight percent.

The average particle size of the copper powder having the above-mentioned oxygen content should be within a range from about 0.5 $\mu$m to about 3 $\mu$m. If the size exceeds about 3 $\mu$m, sintering will be deficient, and if the size is less than about 0.5 $\mu$m, it will be difficult to make the powder into a paste, and evaporation of the organic vehicle will be deficient.

Cuprous oxide has a strong affinity with copper. Hence, cuprous oxide functions as a sintering agent, and after sintering, remains in the sintered particle boundary and prevents penetration of solder, and partly reacts with the substrate to form chemical bonds and improve the joint strength. To secure these effects, it is necessary to add about 10 parts or more by weight of cuprous oxide powder to each 100 parts by weight of copper powder. However, if more than about 15 parts by weight of cuprous oxide powder are added, the solder wettability will be deteriorated, and the strength after aging will be degraded.

If the average particle size of the cuprous oxide powder is too coarse, the above-mentioned functions and effects will not be achieved. It, therefore, is desirable to set the average particle size of the cuprous oxide powder at or less than about 5 $\mu$m, and preferably, at or less than about 2 $\mu$m.

Cupric oxide provides oxygen to the organic vehicle in the firing process, and therefore will be reduced. In this way, cupric oxide assists the combustion of the organic vehicle. To this end, the addition of about 12 parts or more by weight of cupric oxide powder to each 100 parts by weight of copper powder achieves efficient pyrolysis of the organic vehicle during the firing process. If about 17 parts or more by weight of cupric oxide powder is added, sintering of the copper particle will be hindered.

The glass powder or other powdered refractory material serves to wet the surface of the substrate and to facilitate the sintering of the copper powder through liquid-phase sintering. Therefore, it is desirable to add about 7 to about 12 parts by weight of glass powder, or other refractory powder, to each 100 parts by weight of copper powder. To attain an appropriate wettability, it is desirable to select glass powder having a softening point of about 600° C. or less, preferably having a softening point of about 550° C. or less.

The amount of the organic vehicle components relative to all the inorganic components depends on the particular vehicle used. To assure complete evaporation of the organic vehicle, the amount of the organic vehicle components should be from about 5 to about 30 parts by weight organic vehicle components to about 95 to about 70 parts by weight of other inorganic components. To achieve the full advantage of the present invention in improving the wettability, and in assuring complete evaporation of the organic vehicle, the amount of the resin is desirably about 10 parts or less by weight to 100 parts by weight of the organic vehicle.

The present invention will be explained with reference to preferred embodiments according to the present invention. It should be noted that the present invention is in no way limited by these embodiments.

EXAMPLE

To form conductor pads, the pastes having the compositions as shown in Table 1 were printed in an appropriate pattern on 96% alumina ceramic substrates by means of a screen printing machine, and then dried at 120° C. for 10 minutes. The printed substrates then were fired in a nitrogen environment under the following conditions: peak firing temperature—600° C.; peak temperature time—10 minutes; heating-cooling cycle time—60 minutes; and $O_2$ concentration in the firing zone—5 ppm. The conductor pads obtained under these conditions were measured for solder wettability, initial joint strength, and joint strength after aging. The results of the measurements are shown in Table 3. Table 2 describes the characteristics of the materials listed in Table 1.

A. Solder Wettability

A sample to which a soldering flux (Tamur Kaken XA-100) had been applied was immersed in a solder bath at 230° C.±5° C. for 5±0.5 seconds, and then was taken out of the bath. The average solder wet area of ten conductor pads (each pad measuring 2 mm×2 mm) was measured. A sample having a wet area ratio of 90% or more was judged to pass the test, and a sample having a ratio of less than 90% was judged to fail the test.

B. Initial Joint Strength

A sample to which the above-mentioned soldering flux had been applied was immersed in a solder bath at 230° C.±5° C. for 5±0.5 seconds. Then 0.65 mm diameter tinned copper wires were attached to eight 2 mm ×2 mm conductor pads by means of a soldering iron, as shown in the drawing. In the drawing, 1 represents a substrate, 2 a conductor pad, 3 copper wire, and 4 solder.

The soldered copper wire 3 then was pulled by a tension tester in a direction perpendicular to the substrate 1 (in the direction of the arrow) at a velocity of 10 mm/sec to measure the strength needed to separate the conductor pad 2 from the substrate 1. A sample was judged to pass the test when the average of the eight pad measurements was 3 kg or more and the minimum pad measurement was 2.5 kg or more.

C. Joint Strength After Aging

In the same manner as the initial joint strength measurements, copper wires were attached to the conductor pads formed on the substrates and then the said substrates were subjected to a temperature of 150° C. for 250 hours and then the strength of each joint was measured in the same manner as described for initial joint strength. A sample was judged to pass the test when the average of the eight pad measurements was 2.5 kg or more and the minimum pad measurement was 2.0 kg or more.

TABLE 1

| Sample | Copper powder | Cuprous oxide powder | Cupric oxide powder | Glass powder | Sb$_2$O$_3$ powder | Organic vehicle | Inorganic components/ organic vehicle |
|---|---|---|---|---|---|---|---|
| 1  | A 100 | 10.0 | 12.0 | D 7.5  | —   | G 15.0 | 89.6/10.4 |
| 2  | A 100 | 12.0 | 12.0 | D 8.0  | —   | G 24.0 | 84.6/15.4 |
| 3  | A 100 | 15.0 | 15.0 | E 10.0 | —   | G 25.0 | 84.8/15.2 |
| 4  | B 100 | 12.5 | 15.0 | D 10.0 | 0.3 | G 35.0 | 79.7/20.3 |
| 5  | B 100 | 12.5 | 15.0 | E 10.0 | 0.3 | G 52.0 | 72.6/27.4 |
| 6  | B 100 | 11.0 | 17.0 | E 11.0 | 0.5 | H 15.0 | 90.3/9.7 |
| 7  | C 100 | 15.0 | 12.0 | F 12.0 | —   | H 35.0 | 79.9/20.1 |
| 8  | C 100 | 10.0 | 17.0 | F 10.5 | 0.5 | H 15.0 | 90.2/9.8 |
| 9  | C 100 | 12.0 | 15.0 | F 7.0  | —   | H 34.0 | 79.8/20.2 |
| 10 | C 100 | 15.0 | 17.0 | D 7.0  | —   | H 25.0 | 84.8/15.2 |
| C1 | A 100 | 8.0  | 15.0 | D 7.5  | —   | G 23.0 | 85.0/15.0 |
| C2 | A 100 | 12.0 | 10.0 | D 10.0 | —   | G 33.0 | 80.0/20.0 |
| C3 | A 100 | 15.0 | —    | D 10.0 | —   | G 52.0 | 70.6/29.4 |
| C4 | A 100 | —    | 17.0 | E 10.0 | —   | H 32.0 | 79.9/20.1 |
| C5 | B 100 | 16.0 | 12.0 | E 10.0 | —   | H 35.0 | 79.8/20.2 |

TABLE 2

| | |
|---|---|
| Copper Powder A | Mean particle size 1 μm, oxygen content 0.10 weight % (Dowa Kogyo) |
| Copper Powder B | Mean particle size 2 μm, oxygen) content 0.08 weight % (Dowa Kogyo) |
| Copper Powder C | Mean particle size 0.8 μm, oxygen content 0.14 weight % (Dowa Kogyo) |
| Cuprous oxide powder | Dowa Kogyo CS-100, mean particle size 1 μm |
| Cupric oxide powder | Nisshin Kagaku CB-250, mean particle size 3 μm |
| Glass powder D | Nippon Denki Garasu GA-9, softening point 435° C. |
| Glass powder E | Nippon Denki Garasu GA-8, softening point 490° C. |
| Glass powder F | Nippon Denki Garasu LS-0803, softening point 353° C. |
| Organic vehicle G | 5 parts by weight of ethylcellulose (Hercules N-100) dissolved in 95 parts by weight of terpineol |
| Organic vehicle H | 10 parts by weight of ethylcellulose (Hercules N-45) dissolved in 80 parts by weight of terpineol and 10 parts by weight of dibutyl phthalate |

TABLE 3

| Sample | Solder wettability (%) Area | Solder wettability (%) Judgement | Initial joint strength (kg/4 mm$^2$) Average | Initial joint strength (kg/4 mm$^2$) Minimum | Initial joint strength (kg/4 mm$^2$) Judgement | Strength after aging (Kg/4 mm$^2$) Average | Strength after aging (Kg/4 mm$^2$) Minimum | Strength after aging (Kg/4 mm$^2$) Judgement |
|---|---|---|---|---|---|---|---|---|
| 1  | 99 | Pass    | 4.0 | 3.0 | Pass    | 3.0 | 2.0 | Pass |
| 2  | 98 | Pass    | 4.2 | 3.2 | Pass    | 3.2 | 2.1 | Pass |
| 3  | 99 | Pass    | 4.0 | 2.8 | Pass    | 2.8 | 2.3 | Pass |
| 4  | 99 | Pass    | 3.8 | 3.0 | Pass    | 2.8 | 2.0 | Pass |
| 5  | 98 | Pass    | 4.2 | 3.1 | Pass    | 3.2 | 2.1 | Pass |
| 6  | 95 | Pass    | 4.3 | 3.5 | Pass    | 2.6 | 2.0 | Pass |
| 7  | 98 | Pass    | 3.8 | 2.7 | Pass    | 3.0 | 2.5 | Pass |
| 8  | 98 | Pass    | 3.5 | 2.8 | Pass    | 2.8 | 2.3 | Pass |
| 9  | 99 | Pass    | 3.8 | 2.8 | Pass    | 2.8 | 2.1 | Pass |
| 10 | 99 | Pass    | 4.0 | 2.7 | Pass    | 3.0 | 2.2 | Pass |
| C1 | 99 | Pass    | 2.8 | 2.0 | Failure | 2.1 | 0.5 | Failure |
| C2 | 85 | Failure | 2.5 | 2.0 | Failure | 1.6 | 0.2 | Failure |
| C3 | 80 | Failure | 2.0 | 1.5 | Failure | 1.4 | 0.1 | Failure |
| C4 | 90 | Pass    | 2.2 | 1.5 | Failure | 1.8 | 0.3 | Failure |
| C5 | 85 | Failure | 3.2 | 2.5 | Pass    | 2.0 | 1.0 | Failure |

Table 3 clearly indicates the following points:

1) Embodiments 1 through 10 included copper powder having a mean particle size and an oxygen content within the ranges according to the present invention, and appropriate amounts of cuprous oxide powder, cupric oxide powder and glass powder were mixed, and the ratio of the inorganic components and the organic vehicle components was appropriate. Accordingly, the evaporation of the organic vehicle was complete, and sintering of the copper powder was sufficient. As a result, the solder wettability was satisfactory, and the initial joint strength and the strength after aging were high, and all of the values of such characteristics were at or above the pass level.

2) In the case of Control 1 (C1), the mixing ratio of cuprous oxide is less than the lower limit according to the present invention. Accordingly, the initial joint strength and the strength after aging were low, and failed to attain the respective pass levels.

3) In the case of Control 2 (C2), the mixing ratio of cupric oxide was less than the lower limit according to the present invention, and the evaporation of the organic vehicle was deficient, and the sample failed to pass the solder wettability test. As a result, both the initial joint strength and the strength after aging were low and failed to attain the respective pass levels.

4) In the case of Control 3 (C3), no cupric oxide powder was mixed. Hence the organic vehicle did not evaporate, and the solder wettability was extremely low and failed to pass the test. As a result, the initial joint strength and the strength after aging were considerably low and failed to pass the tests.

5) In the case of Control 4 (C4), no cuprous oxide was mixed. As a result, both the initial joint strength and the strength after aging were extremely low and failed to pass the tests.

6) In the case of Control 5 (C5), the mixing ratio of cuprous oxide was greater than the upper limit according to the present invention. As a result, the solder wettability failed to pass the test, and the strength after aging was also low and failed to pass the test.

The copper paste compositions according to the present invention are applicable, in addition to thick film circuits, as electrode materials for ceramic parts, such as various capacitors.

It has therefore been shown that very useful copper paste compositions in practical applications, having satisfactory solder wettability and high initial joint strength and joint strength after aging, can be provided by using copper powder having an oxygen content and a mean particle size within the respective ranges according to the present invention and by controlling the mixing ratios of cuprous oxide powder to cupric oxide powder; glass powder to said copper powder; and the ratio of the organic vehicle components to the inorganic components within the respective ranges according to the present invention.

What is claimed is:

1. A copper paste composition comprising about 95 to about 70 percent by weight of inorganic components and about 5 to about 30 percent by weight of organic vehicle components, said inorganic components comprising a powdered refractory material, and copper powder including cuprous oxide powder and cupric oxide powder in amounts such that about 10 to about 15 parts by weight of cuprous oxide powder, about 12 to about 17 parts by weight of cupric oxide powder, and about 7 to about 12 parts by weight of powdered refractory material, are included for each 100 parts by weight of copper powder.

2. The copper paste composition of claim 1 wherein said copper powder has a mean particle size of about 0.5 to about 3 $\mu$m and an oxygen content between about 0.05 and about 0.15 percent by weight.

3. The copper paste composition of claim 2 wherein said cuprous oxide powder has a particle size range from about 0.5 to about 5 $\mu$m.

4. The copper paste composition of claim 3 wherein said cuprous oxide powder has a particle size range from about 0.5 to about 2 $\mu$m.

5. The copper paste composition of claim 2 wherein said organic vehicle components include a solvent and a resin.

6. The copper paste composition of claim 5 wherein said solvent is selected from the group consisting of terpineol, $C_{10}$ to $C_{18}$ alcohols, and mixtures thereof.

7. The copper paste composition of claim 5 wherein said resin is selected from the group consisting of cellulosic resins, acrylic resins, methacrylic resins, terpene resins and mixtures thereof.

8. The copper paste composition of claim 5 wherein said organic vehicle components include about 10 percent or less by weight of resin.

9. The copper paste composition of claim 2 further comprising about 5 parts or less by weight of an inorganic oxide per 100 parts by weight of said copper powder.

10. The copper paste composition of claim 9 wherein said inorganic oxide is selected from the group consisting of vanadium oxide, lead oxide, antimony oxide and mixtures thereof.

11. The copper paste composition of claim 5 wherein said organic vehicle components further include a plasticizer.

12. The copper paste composition of claim 11 wherein said plasticizer is dibutyl phthalate.

13. The copper paste composition of claim 1 wherein said powdered refractory material is glass.

14. The copper paste composition of claim 13 wherein said glass powder has a softening point of between about 300° C. and about 600° C.

15. A copper paste composition for low temperature firing comprised of copper powder with an oxygen content between about 0.05 to 0.15 weight percent, cuprous oxide powder, cupric oxide powder, and organic vehicle components in amounts such that about 10 to about 15 parts by weight of cuprous oxide powder and about 12 to about 17 parts by weight of cupric oxide powder are included for each 100 parts by weight of copper powder.

16. In a copper paste composition for low temperature firing wherein copper powder is blended into a paste including a binder, a solvent and a powdered refractory material, the paste is applied to a substrate and fired at a temperature sufficient to remove the solvent and the binder from the copper powder and the powdered refractory material and to adhere the copper powder, bound in the refractory material adhered to the substrate, the improvement comprising the copper powder including about 10 to about 15 parts by weight of cuprous oxide powder and about 12 to about 17 parts by weight of cupric oxide powder for each 100 parts by weight of copper powder.

* * * * *